(12) United States Patent
Noda

(10) Patent No.: US 6,479,371 B2
(45) Date of Patent: Nov. 12, 2002

(54) METHOD AND APPARATUS FOR MANUFACTURING THREE-DIMENSIONAL PHOTONIC CRYSTAL STRUCTURE BY FUSION BONDING THE ALIGNED LATTICE LAYERS FORMED ON WAFERS

(75) Inventor: Susumu Noda, Kyoto (JP)

(73) Assignees: Sumitomo Electric Industries, Ltd., Osaka (JP); Kansai Technology Licensing Organization Co., Ltd., Kyoto (JP)

( * ) Notice: Subject to any disclaimer, the term of this patent is extended or adjusted under 35 U.S.C. 154(b) by 0 days.

(21) Appl. No.: 09/757,705

(22) Filed: Jan. 11, 2001

(65) Prior Publication Data

US 2001/0021569 A1 Sep. 13, 2001

(30) Foreign Application Priority Data

Jan. 13, 2000 (JP) ........................................ 2000-004686

(51) Int. Cl.[7] .......................... H01L 21/30; H01L 21/46
(52) U.S. Cl. ...................................................... 438/455
(58) Field of Search .......................... 29/407, 703, 705, 29/714, 740; 89/41.05, 41.06; 250/202, 342; 356/148, 152, 152.2, 153, 398, 400; 438/455, 456, 458

(56) References Cited

U.S. PATENT DOCUMENTS 4,811,062 A * 3/1989 Tabata et al. ................ 356/152

OTHER PUBLICATIONS

Noda et al., "Continuous–Wave Oscillation of MQW DFB Laswer with Air/Semiconductor Gratings Embedded by Mass–Transport–Assisted Wafer Fusion Technique", Wednesday Morning, Cleo '98, pp. 219–220.

Yamamoto et al., Jpn J. Appl. Phys. vol. 37 (1998) pp. 3334–3338 "100–nm–Scale Alignment using Laser Beam Diffraction Pattern Observation Techniques and Wafer Fusion for Realizing Three–Dimensinal Photonic Crystal Structure".

* cited by examiner

Primary Examiner—Michael Sherry
Assistant Examiner—Asok Kumar Sarkar
(74) Attorney, Agent, or Firm—Smith, Gambrell & Russell, LLP

(57) ABSTRACT

Two pieces of semiconductor wafers $10_1$ and $10_2$ to be stacked and fused together are secured to wafer holders $20_1$ and $20_2$ respectively, and are then integrally held at a wafer hold unit 2. Rough position alignment is first applied to these semiconductor wafers $10_1$ and $10_2$ while supplying infrared light thereto from an infrared light source 30 of an infrared light system 3 for detection of a resultant lattice image at a detection unit 5. Then, fine position, alignment is performed while supplying laser light from an laser light source 40 of a laser light system 4 for detection of a resultant diffraction image at the detection unit 5. Thus, in the manufacture of a semiconductor-device having its crystal structure with three-dimensional periodical refractive index distribution employing precision multilayer stack methods by using a wafer fusion, a method and apparatus for manufacturing the semiconductor device is realized which is capable of achieving precise position alignment between lattice layers stacked over each other with reduced complexity in position alignment thereof.

4 Claims, 8 Drawing Sheets

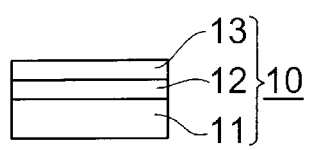
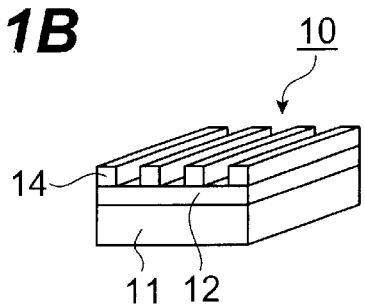
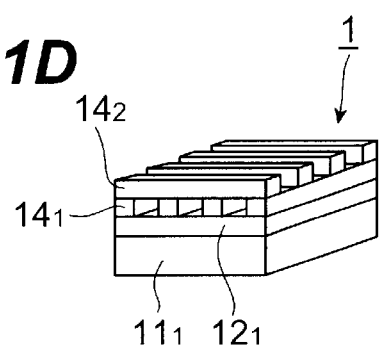
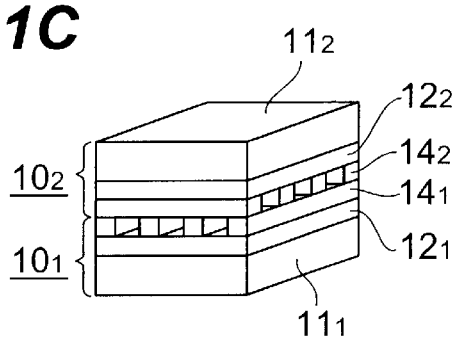
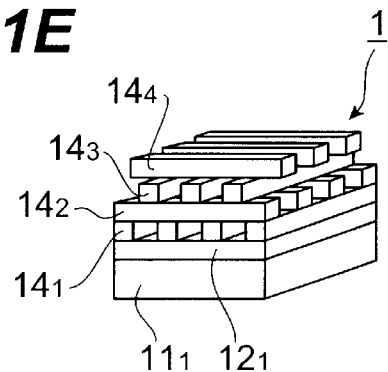

METHOD AND APPARATUS FOR MANUFACTURING THREE-DIMENSIONAL PHOTONIC CRYSTAL STRUCTURE BY FUSION BONDING THE ALIGNED LATTICE LAYERS FORMED ON WAFERS

BACKGROUND OF THE INVENTION

1. Field of the Invention

The present invention relates to a method and apparatus for manufacturing semiconductor devices having crystal structures: with three-dimensional periodical refractive index distribution.

2. Related Background Art

Photonic crystals are specific semiconductor devices having therein a three-dimensional (3D) periodical refractive index distribution structure, which are expected for use as new optical material. With such crystals, a band structure (photonic band) is formed with respect to photon energy in a way corresponding to an electron energy band structure in solid-state crystals. Due to this, photon's energy state that can exist within a photonic crystal is limited, which in turn makes it possible to achieve a wide variety of light controllabilities which have been considered impossible until today, including freely curving light rays with no losses, controlling spontaneous emission light, and the like.

3D structures of the photonic crystals stated above include an asymmetrical face-centered cubic (FCC) structure with asymmetry introduced into standard FCC structures, a diamond structure, and others. Furthermore, a variety of applications are possible, including but not limited to fabrication of a waveguide path through formation of a linear array of defects into these photonic crystals, controlling output light with a light emitting element embedded therein. In view of the applicability to the optical devices, several preferable conditions for these crystals may typically include: (1) materials used are semiconductor-based ones; (2) it is easy to embed the light emitting element in the crystals; (3) it is easy to form defects (disorder of refractive index); and, (4) a flow of current is possible.

SUMMARY OF THE INVENTION

Photonic crystals are manufacturable by several proposed methods including methods by means of self-ordering such as an opal method and a self-cloning method, and a three-direction semiconductor dry etching method. The opal method is for fabricating a 3D crystal structure while letting semiconductor microparticles such as silicon microparticles settle to the bottom in a suspension liquid. This approach is capable of obtaining FCC structures. However, it is difficult to create complete band gaps in this method. Also, formation of the defects is difficult.

The self-cloning method is capable of obtaining simple cubic crystal structures. However, it is difficult to create complete band gaps as in the opal method. And the defects can form only in a single direction.

The three-direction semiconductor dry etching method is for forming 3D structures by use of semiconductor anisotropic etching technique, and capable of obtaining asymmetrical FCC structures. However, high aspect ratios are required in this method, and it is very difficult to fabricate them with sufficient accuracy. Also formation of the defects is difficult.

One approach to avoid these difficulties is to employ a manufacturing method using precision multilayer stack technologies based on wafer fusion (wafer bonding) technique. This method includes the steps, for example, of preparing wafers each having a semiconductor/air diffraction grating layer (lattice layer, two-dimensional structure) as formed on a semiconductor substrate, and then stacking and fusing these wafers' lattice layers together while establishing predetermined positional relations (such as mutually forming angles, periods, etc.) between them, thereby obtaining periodical 3D structures such as an asymmetric FCC structure.

In the above-stated fusion multilayer stack method, it should be required that respective wafers (on-wafer lattice layers) be precisely aligned in position with each other. More specifically, in order to obtain the photonic band, the positional relation between the lattice layers must be accurately determined in stacking the lattice layers, e.g. stacking two lattice layers over each other with a structure period thereof being positionally shifted by a half period.

However, it is not easy to accomplish such precision positional alignment between separate on-wafer lattice layers. Thus, there arise the problems including the problem that any sufficient performances of photonic crystals are hardly obtainable, and the problem that an increased length of time is required for such position alignment process in the manufacture of the photonic crystals.

The present invention has been made in view of the problems stated above, and its object is to provide an improved method and apparatus for manufacturing a semiconductor device having 3D periodical refractive index distribution using precision multilayer stack technique by means of a wafer fusion, which are capable of achieving precision alignment in position between lattice layers being stacked over each other while reducing complexity in position alignment procedure thereof.

To attain the foregoing object, a semiconductor device manufacturing method in accordance with the present invention is a method for manufacturing a semiconductor device having a crystal structure with three-dimensional: (3D) periodical refractive index distribution, characterized in that said method comprises: (1) a wafer fabrication step of forming two semiconductor wafers each having one surface with at least one lattice layer being formed thereon, the lattice layer having a two-dimensional structure including a crystal lattice region as formed with a crystal lattice period and an adjustment lattice region with an adjustment lattice period greater than the crystal lattice period; (2) a wafer hold step of integrally holding the two semiconductor wafers with the lattice layers facing each other; (3) a first alignment step of irradiating observation light onto the two semiconductor wafers being held integrally for detection of a lattice image obtained from the adjustment lattice region to thereby perform rough alignment between the semiconductor wafers; (4) a second alignment step of irradiating laser light onto the two semiconductor wafers with rough alignment applied thereto for detection of a diffraction image obtained from the crystal lattice region to thereby perform fine alignment between the semiconductor wafers; and (5) a wafer fusion step of fusing the two semiconductor wafers after completion of the fine alignment while letting the lattice layers facing each other be stacked over each other.

In addition, a semiconductor device manufacturing apparatus of the invention is an apparatus for manufacturing a semiconductor device having a crystal structure with 3D periodical refractive index distribution, characterized in that said apparatus comprises: (a) wafer hold means for integrally holding two semiconductor wafers each having one surface with at least one lattice layer having a two-dimensional structure being formed thereon with the lattice layers facing each other; (b) a first light source for irradiating observation light onto the two semiconductor wafers being held integrally; (c) first detection means for detecting a lattice image obtained by the observation light to thereby perform rough alignment between the semiconductor wafers; (d) a second light source for irradiating laser light onto the two; semiconductor wafers being held integrally; and (e) second detection means for detecting a diffraction image obtained by the laser light to thereby perform fine alignment between the semiconductor wafers.

With the manufacturing method and apparatus stated above, a diffraction image as formed by a multilayer lattice structure upon irradiation of laser light is used to perform position alignment between lattice layers of two semiconductor wafers being stacked and fused together. More specifically, each lattice layer is expected to function as a diffraction grating upon irradiation of the laser light. At this time, each diffraction lights pot in the diffraction image being detected, e.g. first-order diffraction light spot, will behave to change in intensity due to mutual relation in position between stacked lattice layers (such as shift in lattice period). Thus, it is possible by utilizing this intensity change to achieve precise position alignment therebetween.

Another important feature of the invention is that prior to the position alignment using the laser light diffraction image, rough position alignment is carried out by use of a lattice image obtained by the observation light using normal light without coherence. While the laser light assisted position alignment is effective for fine alignment between the lattice layers for functioning as diffraction gratings, exclusive use of this alignment method alone may result in a decrease in alignment efficiency. In contrast, first performing rough alignment while looking at the observation light lattice image (image of a lattice structure), and subsequently performing fine alignment (fine position adjustment) using the laser beam diffraction image, makes it possible to efficiently achieve precise position alignment between the lattice layers.

A further feature of the manufacturing method of the invention is that each lattice layer of the semiconductor wafers to be stacked is formed with a structure including a ordinary crystal lattice region and an adjustment lattice region, wherein the latter is greater in lattice period than the former. Providing the adjustment lattice region with greater lattice period than that used for photonic crystals facilitates the position alignment using the lattice image. Preferably, such adjustment lattice region is provided at specified part such as for example an edge portion of lattice layer since this region is the one that does not constitute any photonic crystals.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

FIGS. 1A to 1E schematically illustrate process steps of a photonic crystal manufacturing method using precision multilayer stack technique by means of a wafer fusion.

DESCRIPTION OF THE PREFERRED EMBODIMENTS

Figure 2:
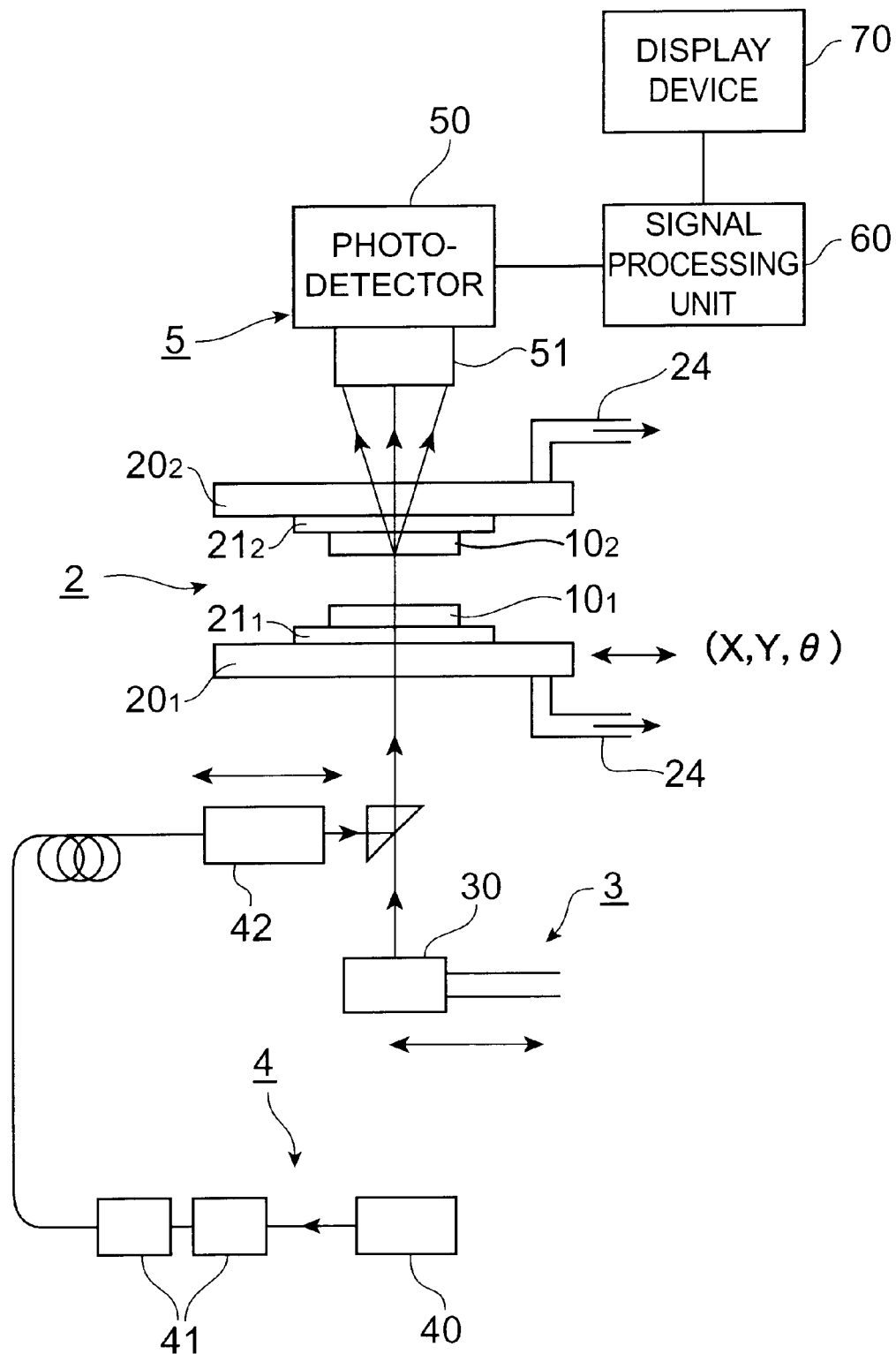
FIG. 2 is a schematic diagram showing a configuration of a photonic crystal manufacturing apparatus in accordance with an embodiment of the invention.

The preferred embodiments of the semiconductor device manufacturing method and apparatus in accordance with the present invention will be described below in detail with reference to the drawings. The same elements will be denoted by the same reference symbols in the description of the drawings and redundant description will be omitted. It is also noted that dimensional ratios in the drawings do not always exactly match those in the description.

FIGS. 1A to 1E schematically illustrate process steps of a photonic crystal manufacturing method in accordance with one embodiment using precision multilayer stack technique by means of a wafer fusion. The photonic crystal is a semiconductor device having a three-dimensional (3D) periodical refractive index distribution.

Firstly, as shown in FIG. 1A, an AlGaAs etching stop layer 12 and a GaAs semiconductor thin-film layer 13, where GaAs is for use as the material of the photonic crystal, are formed on a GaAs semiconductor substrate (semiconductor wafer) 11. Next, as shown in FIG. 1B, a predetermined two-dimensional (2D) basic structure is formed on the semiconductor thin-film layer 13 by electron beam lithography or photolithography, and a dry etching process.

In FIG. 1B, the 2D basic structure of a lattice layer 14 obtained after the etching process being applied to the semiconductor thin-film layer 13 is set as a striped pattern. Thus, the GaAs semiconductor substrate 11 is obtained which has its one surface on which the GaAs lattice layer 14 is formed with the AlGaAs etching stop layer 12 sandwiched therebetween. The resultant semiconductor elements that consists of the semiconductor substrate 11, the etching stop layer 12, and the lattice layer 14 is used as an intermediate element for manufacture of the semiconductor device, as will be explained. In the rest of the description, this semiconductor element having the 2D structure formed on the wafer will be referred to hereinafter as a semiconductor wafer element 10 or simply semiconductor wafer 10.

It should be noted that although AlGaAs/GaAs semiconductor is used as semiconductor materials in the example discussed herein, other materials may also be used. One example of these alternative materials is InGaAsP/InP semiconductor. If this is the case, the semiconductor wafer element 10 can be constituted with the semiconductor substrate 11 of InP, the etching stop layer 12 of InGaAsP, and the semiconductor thin-film layer 13 (lattice layer 14) of InP.

Subsequently, as shown in FIG. 1C, two pieces of semiconductor wafers $10_1$ and $10_2$ each having the structure stated above are prepared. These wafers $10_1$ and $10_2$ are stacked with the lattice layers $14_1$ and $14_2$ facing each other, and fused by a wafer fusion process. The lattice layers $14_1$ and $14_2$ are stacked so that their striped patterns cross at right angles as shown in the figure. Under this condition, the semiconductor wafers $10_1$ and $10_2$ are fused together by heating in a hydrogen atmosphere.

Note here that before stacking the semiconductor wafers $10_1$ and $10_2$, it will be preferable to clean up the respective wafer surfaces and remove natural oxide films, and then apply hydrophilic processing to the wafer surfaces for termination with OH-groups. At this time, the semiconductor wafer elements $10_1$ and $10_2$ thus stacked will be combined together by hydrogen bond even under room temperatures. Moreover, applying heating processing thereto permits dehydration reaction to take place causing them to be more tightly fused together to thereby improve the resultant fusion strength thereof.

Thereafter, as shown in FIG. 1D, selective etching is applied to the semiconductor wafer $10_2$ out of the semiconductor wafers $10_1$ and $10_2$ thus stacked and fused together to thereby remove the semiconductor substrate $11_2$ and the etching stop layer $12_2$. Thus, a semiconductor device 1 having a 3D multilayer lattice structure is obtained, wherein the lattice layer $14_2$ is added on the 2D lattice layer 14 (lattice layer $14_1$) of the semiconductor wafer 10 shown in FIG. 1B in such a manner that their striped patterns cross at right angles to each other.

Furthermore, by repeating the cycle of these stacking, fusion and substrate selective removal processes (see FIGS. 1C and 1D) for a plurality of times, the 3D structure photonic crystal is obtained as the semiconductor device. For example, by cleaving the semiconductor device 1 shown in FIG. 1D into two pieces, stacking and fusing these pieces together with the lattice layers facing each other, and then, performing removal of one substrate, a semiconductor device shown in FIG. 1E having four lattice layers $14_1$ to $14_4$ stacked and fused together can be obtained. With this method, the resultant layer thickness of crystal (stack number of lattice layers) will be doubled per repetition of the processes. For example, if such process is repeated about two or three times (about 8 or 16 layers in stack number), then the sufficient photonic band can be obtained.

With the multilayer structure of the lattice layers 14 as formed in the way discussed above, the one that has two lattice layers 14 of perpendicular striped patterns being stacked on each other forms the {001} plane of a face-centered cubic (FCC) structure, and as a result an asymmetrical FCC structure is obtained. Note here that an important feature of the above-stated precision multilayer stack method as to multilayer structure fabrication processes lies in adjustment of a lattice period (positional relation) of the stripes between respective lattice layers 14.

More specifically, in order to realize the photonic crystal, two overlapping lattice layers 14 which are multilayered with a another layer sandwiched therebetween and are parallel in striped pattern, e.g. the lattice layers $14_1$ and $14_3$, or the lattice layers $14_2$ and $14_4$ in FIG. 1E, must be precisely disposed with their striped pattern positions being shifted by a half period relative to each other as shown in FIG. 1E. Accordingly, alignment in position between these lattice layers 14 will become very important in the manufacture of the photonic crystal. The method and apparatus for manufacturing semiconductor, devices such as the photonic crystals in accordance with the present invention is aimed at achievement of such precise stacking of the lattice layers while at the same time making easier the position alignment process thereof.

FIG. 2 is a schematic diagram showing a configuration of a semiconductor device (photonic crystal) manufacturing apparatus in accordance with an embodiment of the invention. The manufacturing apparatus shown herein is the one for use in position alignment between respective lattice layers of two pieces of the semiconductor wafer elements $10_1$ and $10_2$ being multilayered on each other. As for the two semiconductor wafers $10_1$ and $10_2$ to be stacked and fused together, the wafer shown in FIG. 1B as fabricated through growth of respective layers and etching processes, the wafer shown in FIG. 1D or 1E as manufactured through one or more additional layer stacking and fusion processes, and so on, can be used.

The two semiconductor wafers $10_1$ and $10_2$ are integrally held together by a wafer hold means with the respective lattice layers 14 facing (opposing) each other, and are then subjected to mutual position alignment (position check and position adjustment) processes. A wafer hold unit 2 for use as the wafer hold means in this embodiment is constructed with wafer holders $20_1$ and $20_2$. The semiconductor wafers $10_1$ and $10_2$ are held on the wafer holders $20_1$ and $20_2$ via sub-holders $21_1$ and $21_2$ respectively while causing respective lattice layers to place on the inner side.

Figure 3:
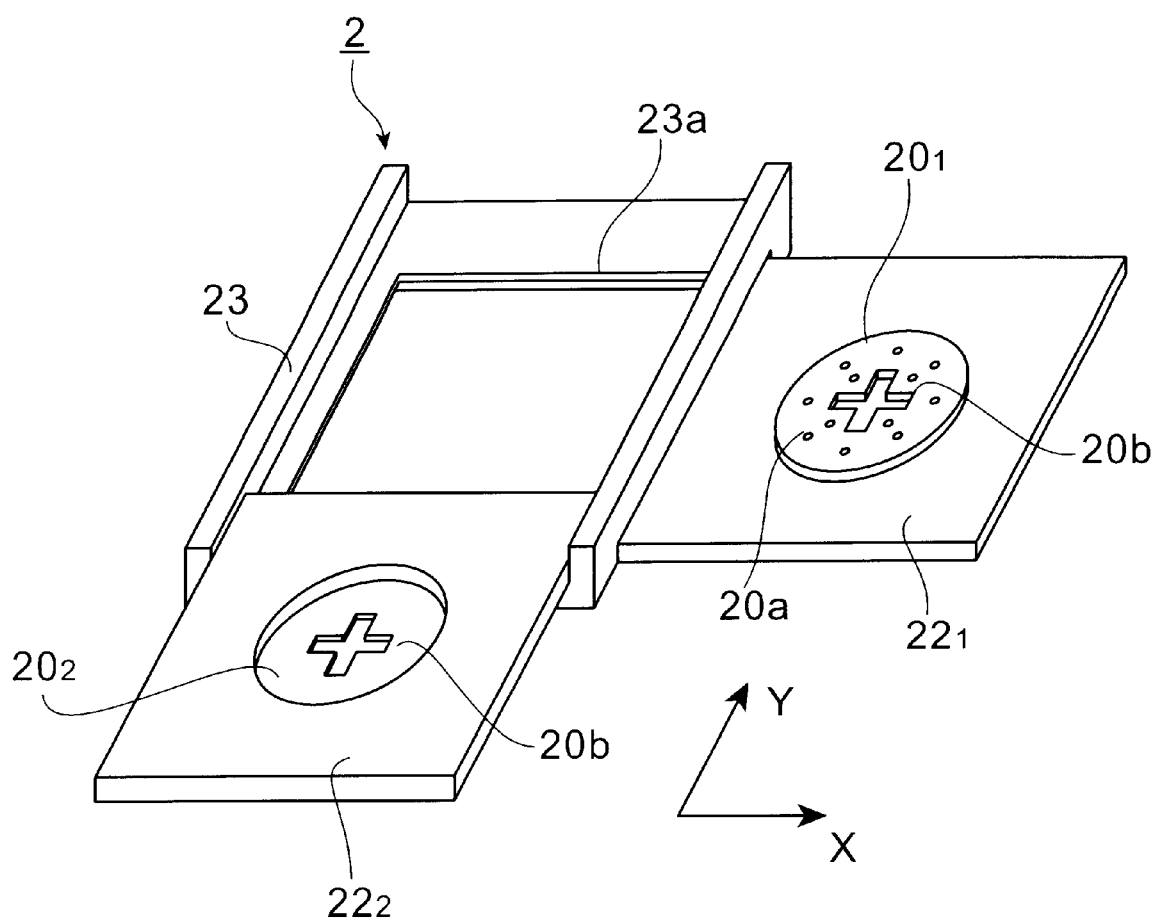
FIG. 3 is a perspective view showing an example of a structure of wafer hold means used in the manufacturing apparatus shown in FIG. 2.

These wafer holders $20_1$ and $20_2$ are integrally supported by a support mechanism, thus constituting the wafer hold unit 2 for integrally holding the semiconductor wafers $10_1$ and $10_2$ together. FIG. 3 is a perspective view showing an example of a structure of such wafer hold unit 2 in the state that it holds no wafers. In this wafer hold unit 2, a support plate $22_1$ to which the wafer holder $20_1$ of circular shape for holding the semiconductor wafer $10_1$ is secured, is attached to lower part of the support mechanism 23. In addition, a support plate $22_2$ to which the wafer holder $20_2$ of circular shape for holding the semiconductor wafer $10_2$ is secured, is attached to upper part of the support mechanism 23. The two semiconductor wafers $10_1$ and $10_2$ are held integrally by using this unit. Furthermore, a predetermined portion of the support mechanism 23 lying between the wafer holders $20_1$ and $20_2$ is formed as an light passage portion 23a with an opening, glass-covered one, and so on.

A respective one of the wafer holders $20_1$ and $20_2$ is a vacuum chuck. The semiconductor wafers $10_1$ and $10_2$ are held and fixed onto the wafer holders $20_1$ and $20_2$ by vacuum pumping from a pumping port 20a using an evacuation system 24 (see FIG. 2). Moreover, one of the two wafer holders $20_1$ and $20_2$ is constructed so that precise position adjustment in directions X, Y, and θ is possible by using piezo-actuators. Note that in FIG. 3, the wafer hold unit 2 is depicted in the state that both support plates. $22_1$ and $22_2$ are pulled out of the support mechanism 23 to show the structure of the wafer holders $20_1$ and $20_2$.

The position alignment between the semiconductor wafers $10_1$ and $10_2$ is performed by using observation light and laser light. In the manufacturing apparatus shown in FIG. 2, an infrared light system 3 including an infrared light source (first light source) 30 for outputting infrared light as the observation light, and a laser light systems 4 including a laser light source (second light source) 40 for outputting the laser light (laser beam) are provided for supplying the semiconductor wafer is $10_1$ and $10_2$ with the observation light and the laser light for position alignment.

In the infrared light system 3, the infrared light output from the infrared light source 30 is irradiated onto the semiconductor, wafers $10_1$ and $10_2$ being held integrally, directly or indirectly via a given optical system. In the laser light system 4, the laser light output from the laser light source 40 is irradiated onto the semiconductor wafers $10_1$ and $10_2$ via two optical isolators 41, a optical collimator 42, and a given optical system.

Optical guiding of these light beams is also achievable by use of optical guide means such as optical fibers or else. The output light beams from these optical systems 3, 4 are each irradiated onto the semiconductor wafers $10_1$ and $10_2$ from the lower side thereof. Therefore, the optical systems 3, 4 are each arranged to be movable, and upon execution of position alignment using the infrared light or laser light, either one of them is moved toward a light irradiation position of the lower side to thereby permit execution of the intended alignment. Note however that in FIG. 2, the optical systems 3, 4 are both depicted at the respective light irradiation positions for explanation.

The infrared light or laser light, output from the optical system 3, 4 and passed through the semiconductor wafers $10_1$ and $10_2$ being held by the wafer hold unit 2, is detected by a detection unit 5. The detection unit 5 in this embodiment is constructed with an photodetector 50 that is capable of detecting a two-dimensional (2D) light image and a microscope 51 as connected to the photodetector 50. The light image generated with the infrared light or laser light passed through the semiconductor wafers $10_1$ and $10_2$ is detected by the photo detector 50 via the microscope 51. Detection signals output from the photodetector 50 are processed by a signal processing unit 60. One example of the photodetector 50 is a CCD (charge-coupled device) camera. Moreover, a display means such as a display device 70 connected to the signal processing unit 60 can be applied for displaying the 2D light image, such as a lattice image or diffraction image as will be described later, as a 2D image to thereby enable operators to view the 2D light image.

The detection unit 5 is constructed with two detection units, namely, a first detection unit for detecting a lattice image obtained by the infrared light output from the infrared light source 30 and then passed through the semiconductor wafers $10_1$ and $10_2$, and a second detection unit for detecting a diffraction image obtained by the laser light output from the laser light source 40 and then passed through the semiconductor wafers $10_1$ and $10_2$. In this embodiment the first and second detection units are designed into the single detection unit 5 using in common the identical detection system including the photodetector 50. Note however that when the need arises, these first and second detection units can be separately provided as independent units which can move together with the infrared light system 3 and the laser light system 4, while permitting replacement of these detection units in a way corresponding to replacement of the optical systems.

Figure 4:
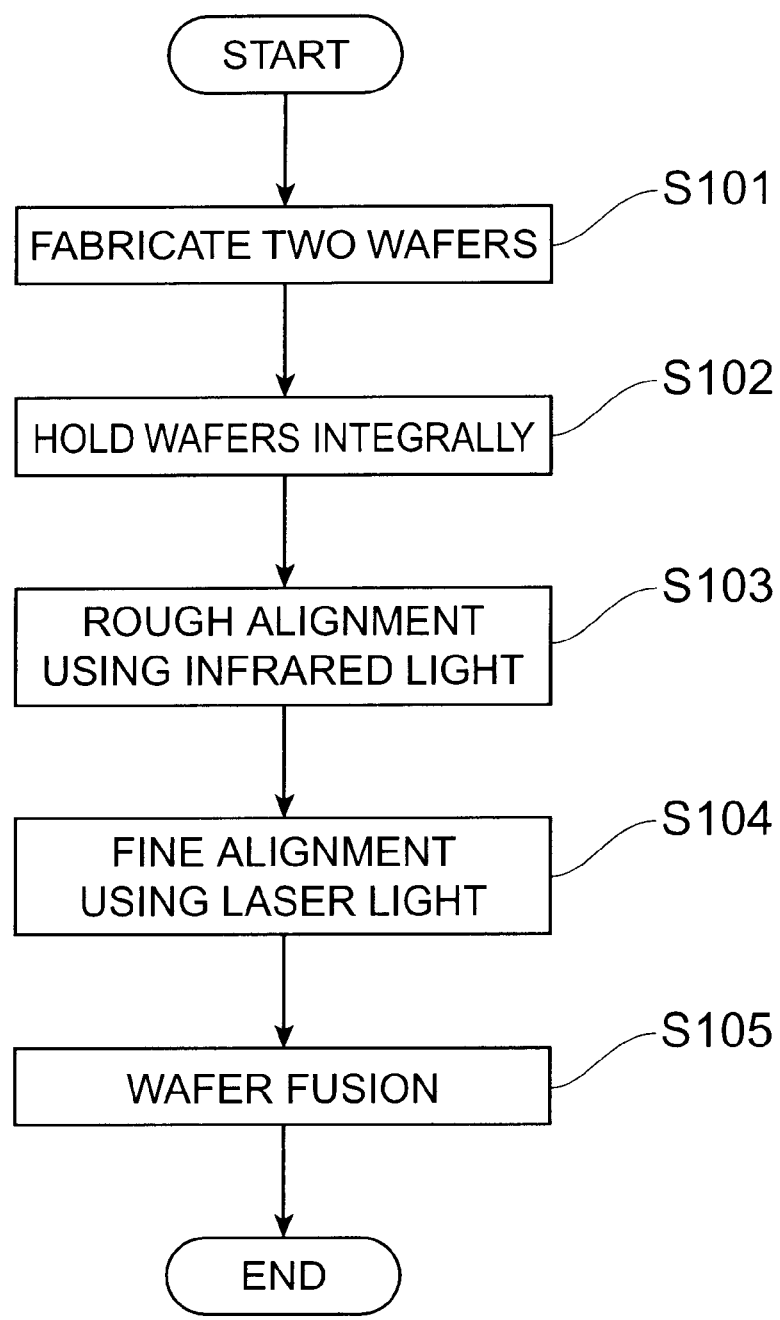
FIG. 4 is a flowchart showing steps of a photonic crystal manufacturing method using the manufacturing apparatus shown in FIG. 2 in accordance with an embodiment of the invention.

An explanation will now be given of a photonic crystal manufacturing method using the manufacturing apparatus shown in FIGS. 2 and 3 with reference to FIGS. 1A to 1E also. FIG. 4 is a flowchart showing process steps of the Photonic crystal manufacturing method in accordance with an embodiment of the invention.

Firstly, two separate semiconductor wafer elements 10 are fabricated, each having the semiconductor substrate 11 and the lattice layer 14 formed on the substrate 11 which has a 2D structure such as the striped pattern (step S101). A respective one of the semiconductor wafers 10 prepared here may be the one that has one lattice layer 14 as shown in FIG. 1B, or alternatively any one of the semiconductor wafers shown in FIGS. 1D and 1E, which has multiple lattice layers 14 as fabricated by execution of one or a plurality of the layer stacking and fusion processes. It is also permissible that the two semiconductor wafers 10 are different from each other in lattice layer stack number.

Figure 5:
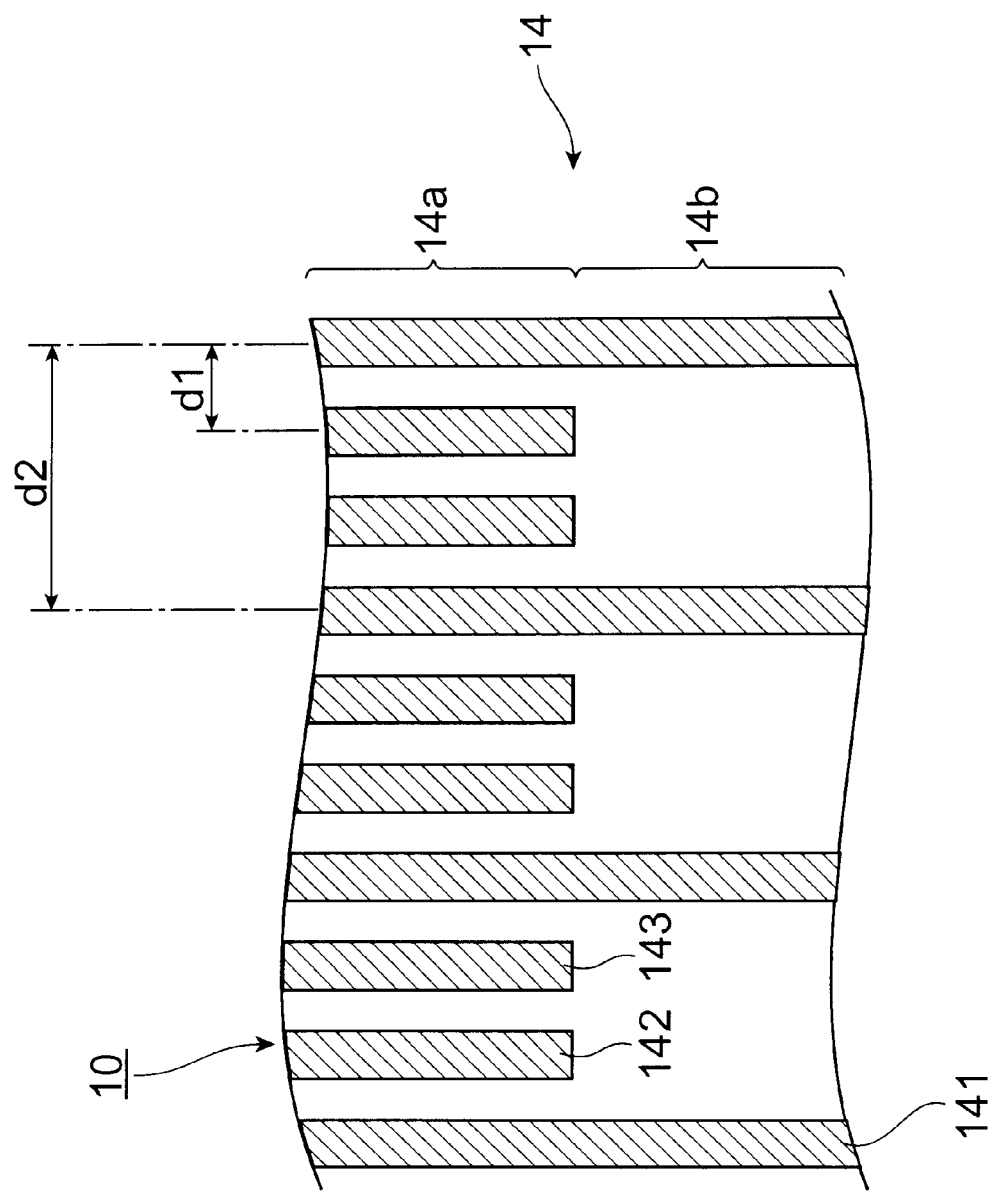
FIG. 5 is an enlarged partial plan view of a lattice layer of a semiconductor wafer for use in the manufacture of a photonic crystal.

Note here that the lattice layer 14 of each of the semiconductor wafers 10 being stacked and fused together is formed into a structure having two lattice regions different in lattice period from each other, i.e. a crystal lattice region 14a as formed with a crystal lattice period d1, and an adjustment lattice region 14b with a adjustment lattice period d2 as shown in FIG. 5. The crystal lattice region 14a is the region which makes up the 3D structure of the photonic crystal after completion of the multilayer stacking and fusion processes and will be used for fine position alignment between the semiconductor wafers $10_1$ and $10_2$. The adjustment lattice region 14b, by contrast, is the region that is formed to have the adjustment lattice period d2 greater than the crystal lattice period d1 and will be used for rough position alignment between the semiconductor wafers $10_1$ and $10_2$.

The adjustment lattice region 14b is the region that constitute no photonic crystals. Preferably this region is formed at an edge portion of the semiconductor wafer 10 for example. In FIG. 5, respective stripes making up the lattice layer 14 include three neighboring stripes 141, 142, and 143, one stripe 141 of which is formed to extend from the crystal lattice region 14a up to the adjustment lattice region 14b placed at the wafer edge, and two remaining stripes 142, 143 of which are formed in the crystal lattice region 14a only.

By repeating this pattern with three stripes, the lattice structure of the crystal lattice region 14a with period d1 and the lattice structure of the adjustment lattice region 14b with period d2 that is three times greater than the period d1 are completed. Here, it is preferable that the lattice period d2 of the adjustment lattice region 14b is designed to fall within a range of 2 μm to 5 μm (micrometers) corresponding to the wavelength of infrared light, because this region 14b is used for position alignment using the infrared light as will be described later.

The two semiconductor wafers $10_1$ and $10_2$ each having the lattice layer 14 with the above-stated structure are placed and held on the wafer holders $20_1$ and $20_2$ of the manufacturing apparatus shown in FIG. 2, respectively. At this time, the semiconductor wafers $10_1$ and $10_2$ are held integrally at the wafer hold unit 2 in such a manner that their specific surfaces on which respective lattice layers are formed are placed on the inner side while causing these lattice layers to face each other (step S102, see FIG. 1C).

Next, rough position alignment is performed using the infrared light ((observation light) between the two semiconductor wafers $10_1$ and $10_2$ being integrally held together (step S103). Here, the infrared light from the infrared light system 3 is irradiated onto the semiconductor wafers $10_1$ and $10_2$, and then, the resulting 2D light image of lattice image, obtained by the infrared light passed therethrough, is detected by the photodetector 50 via the microscope 51. Preferably the infrared light for use:as the observation light may be an infrared light beam, with a wavelength ranging from 2 μm to 3 μm.

Figure 6:
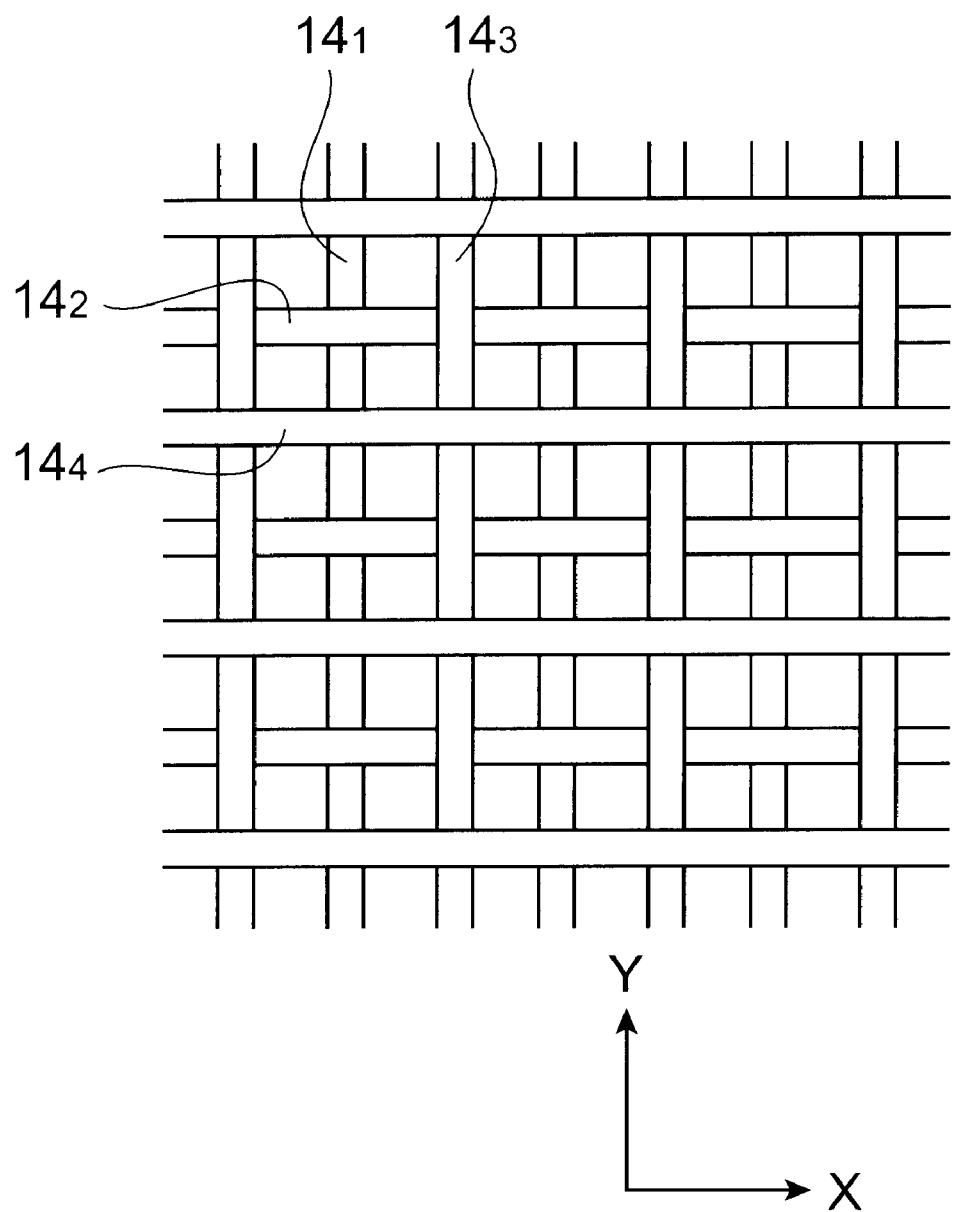
FIG. 6 is a plan view showing an example of a lattice image obtained by infrared light.

One example of the resultant lattice image is shown in FIG. 6. This lattice image is the one obtainable through observation from the detector unit 5 side, and in the case where the semiconductor wafer $10_1$ with the lattice layers $14_1$ and $14_2$ formed thereon and the semiconductor wafer $10_2$ with the lattice layers $14_3$ and $14_4$ formed thereon are held integrally while facing each other. Respective lattice layers $14_1$, $14_2$, $14_3$, and $14_4$ are multilayered in this order of sequence from the semiconductor substrate 11 of the semiconductor wafer $10_1$ side (from the lower side in FIG. 2). In the lattice image shown in FIG. 6, the lattice image obtained from the respective adjustment lattice regions 14b of the lattice layers $14_1$ to $14_4$ is shown.

In the example shown in FIG. 6, the lattice layers $14_1$ and $14_3$ are disposed in parallel with a positional shift by the half period therebetween, and similarly, the lattice layers $14_2$ and $14_4$ are disposed in parallel with a positional shift by the half period therebetween, to thereby constitute the photonic crystal by the 3D multilayer lattice structure (see FIG. 1E). In addition, the lattice layers $14_1$ and $14_3$, and the lattice layers $14_2$ and $14_4$ are disposed in such a manner that perpendicular directions (i.e. X-axis direction and Y-axis direction shown in FIG. 6) are the respective longitudinal directions of striped. patterns. With such positional relationship between these lattice layers, the rough alignment between the. semiconductor wafers $10_1$ and $10_2$ is carried out through position adjustment while checking the lattice image by the infrared light.

Here, regarding this position alignment based on the lattice image, it is preferable that the lattice period d2 of the adjustment lattice region 14b is equivalent to odd multiples of the lattice period d1 of the crystal lattice region 14a. For example, in the lattice layer 14 shown in FIG. 5, the adjustment lattice period d2 is three times greater than the crystal lattice period d1. With such odd multiple value setup feature, as shown in FIG. 6, the multilayer lattice structure with the half period shift can be obtained even in the crystal lattice region 14a, by execution of position alignment with the half period shift in the adjustment lattice region 14b.

Subsequently, fine position alignment is performed using the laser light between the two semiconductor wafers $10_1$ and $10_2$, which have already completed the rough alignment (step S104). Here, the laser light from the laser light system 4 is irradiated onto the semiconductor wafers $10_1$ and $10_2$, and then, the resulting 2D light image of diffraction image, obtained by the laser light passed therethrough. is detected by the photodetector 50 via the microscope 51.

Figure 7:
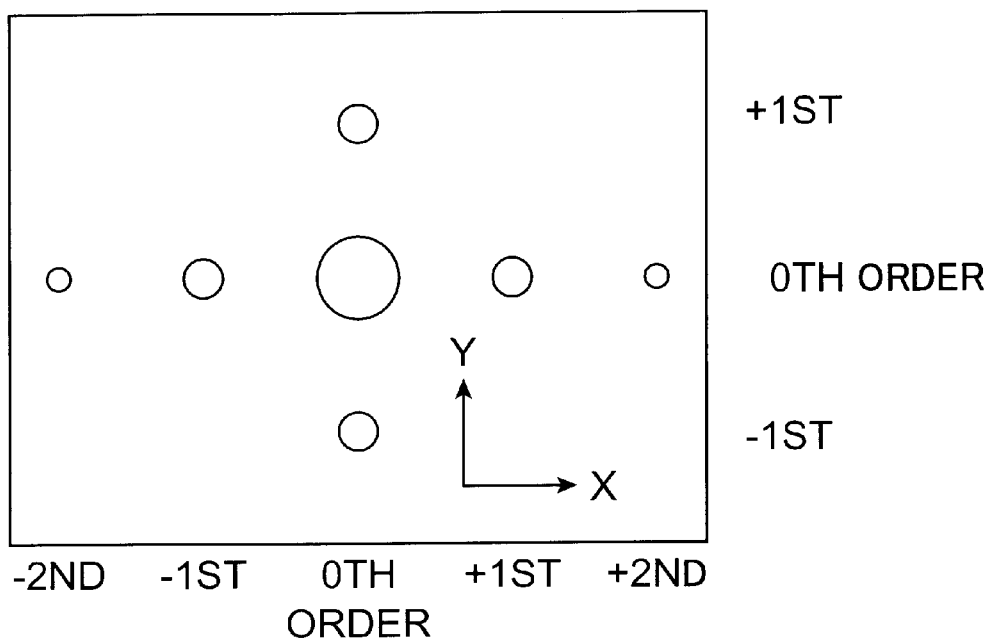
FIG. 7 is a plan view showing an example of a diffraction image obtained by laser light.

One example of the resultant diffraction image is shown in FIG. 7. This diffraction image is the one obtainable upon irradiation of the laser light onto the crystal lattice regions 14a in the lattice layers 14.

At this time, the respective lattice layers $14_1$ to $14_4$ function as diffraction gratings. Note here that the lattice layers are similar in structure to those shown in FIGS. 1E and 6. As shown in FIG. 7, the diffraction light spots of more than first-order are generated in the X-axis and Y-axis directions along which the respective lattice layers are aligned, with the position of the zeroth-order diffraction light spot being as the center thereof.

In the apparatus :shown in FIG. 2, the wafer holders $20_1$ and $20_2$ are made from metals that do not permit any light rays to pages therethrough. In addition, the light passage portion 20b is formed therein, namely, the portion of an opening having a cross-like shape with the X-axis and Y-axis directions being as its two axes as shown in FIG. 3. The opening shape of this light passage portion 20b is a shape extending from the position of 0th-order diffraction light of the diffraction image toward respective directions along which diffraction light rays of more than 1st-order are emitted to thereby permit selective passing of light components of the diffraction image, and corresponds to the diffraction image shown in FIG. 7. With use of such shape of the light passage portion 20b, it becomes possible to reduce incidence of light components other than the diffraction light onto the detector unit 5. Note however that the wafer holders $20_1$ and $20_2$ should not be limited to this structure and may alternatively be replaced with other appropriate holders including metallic holders having circular openings, glass-made holders capable of allowing passing of light rays with predetermined wavelengths such as infrared light, and so on.

Figure 8:
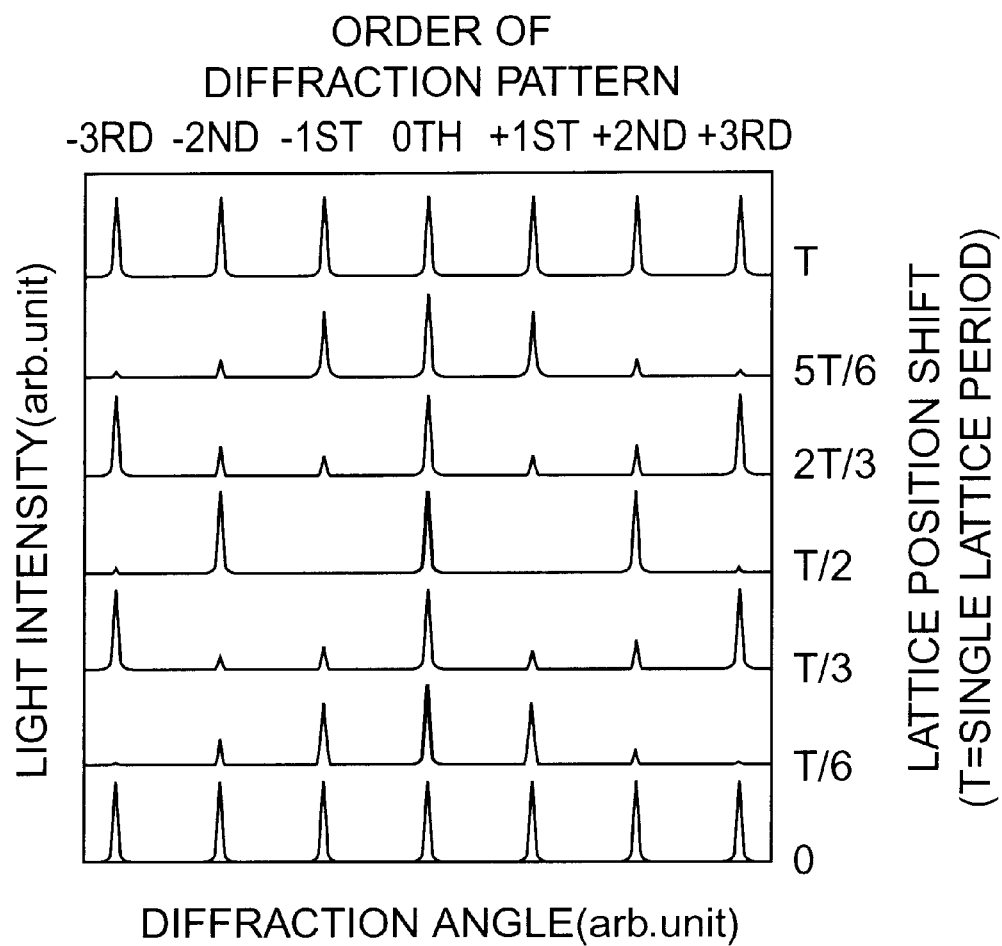
FIG. 8 is a graph for explanation of a position alignment method using the diffraction image shown in FIG. 7.

The above-stated diffraction light spots of more than 1st-order behave to change in intensity (or intensity ratio) with a change in positional relation between the respective lattice layers $14_1$ to $14_4$. Therefore, detecting such intensity change makes it possible to perform the fine alignment of the lattice layers. One example of such intensity change of the diffraction light is shown in FIG. 8. Here, in this graph, −3rd through 0th to +3rd-order diffraction light intensities are shown, with respect to the diffraction patterns when the stripe position is shifted by 0, T/6, T/3, T/2, 2T/3, 5T/6, and between the parallel disposed lattice layers, where "T" indicates the lattice period of the lattice layer (equivalent to the period d1 shown in FIG. 5).

In these diffraction patterns shown herein, the intensities of the 1st-order diffraction light spots (−1st-order and +1st-order) stay minimal when the lattice layer layout of the half period shift is established. Thus, it is possible by utilizing this intensity change to perform the position alignment of the half period shift lattice structure. In the case that half period shift positioning is to be respectively carried out with respect to two directions along the X-axis and Y-axis, similar alignment process can be applied with respect to the 1st-order diffraction light in the X-axis direction and 1st-order diffraction light in the Y-axis direction. Moreover, in the case of the eight-layer or sixteen-layer stack, it is possible to perform the alignment by use of the diffraction light of more than 2nd-order in a similar way.

After completion of precise position alignment of the semiconductor wafers $10_1$ and $10_2$ through steps S103 and S104, the semiconductor wafers $10_1$ and $10_2$ are fused together by wafer fusion in the state that the respective lattice layers are stacked on each other (step S105). Note that this wafer fusion is done at fusion apparatus rather than. at the apparatus shown in FIG. 2, in such a way that the two semiconductor wafers $10_1$ and $10_2$ thus aligned are moved to the fusion apparatus with the wafers being. integrally held together. The wafer fusion method as used herein is as described previously with reference to FIGS. 1A to 1E. If necessary, one substrate is removed away after completion of the wafer fusion process as shown in FIG. 1D. Alternatively, it may also be permissible that a series of the above-stated alignment, multilayer stacking, and fusion processes will be repeated for a plurality of times.

In the photonic crystal (semiconductor device) manufacturing method and apparatus stated above, precise position alignment between the lattice layers on two semiconductor wafers to be stacked and fused together is efficiently realized by first performing the rough alignment based on the lattice image obtained upon irradiation of the observation light onto the semiconductor wafers, and then, performing the fine alignment based on the diffraction image obtained upon irradiation of the laser light.

More specifically, when irradiating the laser light onto the 3D lattice structure consisting of the multiple lattice layers each having the 2D structure, each lattice layer functions as a diffraction grating and the diffraction image can be obtained. By detecting the intensity change of diffraction light on this diffraction image, it becomes possible to perform the precise position alignment between the lattice layers (between the semiconductor wafers).

Here, although the laser light assisted alignment method is very effective for fine position alignment, alignment by using this method alone would result in an increase in time required for the position alignment process. In contrast, by using the two-step position alignment method, namely, first performing the rough alignment based on the lattice transmitted image obtained by the ordinary observation light rather than the diffraction images, and thereafter, performing the fine alignment (fine position adjustment) based on the diffraction image, complexity in position alignment procedure is reduced and the alignment process can be greatly improved in efficiency.

Another feature relating to the structure of the lattice layers of the semiconductor wafers being stacked and fused together is that the adjustment lattice region with greater lattice period is provided separately from the crystal lattice region which makes up the photonic crystal structure after completion of the multilayer stacking and fusion processes, corresponding to the two-step alignment method stated above. While the crystal lattice region can be used as the diffraction grating during the position alignment by the laser light, this region is too small in lattice period to perform the position alignment based on the lattice image, which in turn makes it difficult to perform the rough alignment. On the contrary, by providing separately the adjustment lattice region with large period, it becomes possible to facilitate execution of the rough alignment using the lattice image by the observation light.

Note that the above-stated position alignment method offers an accuracy of alignment between the lattice layers of, for example, about 50 nm (nanometers) in case that the piezo-actuator is employed for the position adjustment as in the embodiment stated above. This accuracy is enough to obtain the photonic band.

The semiconductor device manufacturing method and apparatus in accordance with the present invention should not be limited to the embodiments described above, but various modifications and changes can be made onto the apparatus configurations and process steps. In addition, with regard to the 3D multilayer lattice structure making up a photonic crystal, even where a structure such as defects is partly formed therein for purposes of forming a waveguide or embedding a light emitting element, and so on, it is possible to apply thereto the above-stated alignment method with precision multilayer stack method.

The semiconductor device manufacturing method and apparatus in accordance with the present invention can be utilized as a method and apparatus, in precise multilayer stack technique for fabrication of a semiconductor device (photonic crystal or the like) having a crystal structure with 3D periodic refractive index distribution through fusing of lattice layers, which can align respective lattice layers precisely with reduced complexity, by performing position alignment of respective lattice layers with the two-step position alignment method using observation light and laser light.

The photonic crystal having the 3D crystal structure stated above is expected as optical material for realizing a variety of kinds of light controllabilities by the presence of the photonic band, which have been considered impossible until today. In addition, it becomes possible to apply the photonic crystal for a wide variety of optical devices by forming a specified defect structure into crystals, such as forming a waveguide or embedding a light emitting element. The precise multilayer stack method is an useful photonic crystal manufacturing method also in view of the fact that such defect formation can be done with high degree of freedom. Even in the case of formation of such defects, the position alignment method described above is similarly applicable thereto, thus making it possible to achieve high-performance optical devices utilizing photonic crystals.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A method for manufacturing a semiconductor device having a crystal structure with three-dimensional periodical refractive index distribution, characterized in that said method comprises:

a wafer fabrication step of forming two semiconductor wafers each having one surface with at least one lattice layer being formed thereon, said lattice layer having a two-dimensional structure including a crystal lattice region as formed with a crystal lattice period and an adjustment lattice region with an adjustment lattice period greater than said crystal lattice period;

a wafer hold step of integrally holding said two semiconductor wafers with said lattice layers facing each other;

a first alignment step of irradiating a light beam onto said two semiconductor wafers being held integrally for detection of a lattice image obtained from said adjustment lattice region to thereby perform rough alignment between said semiconductor wafers;

a second alignment step of irradiating laser light onto said two semiconductor wafers with rough alignment applied thereto for detection of a diffraction image obtained from said crystal lattice region to thereby perform fine alignment between said semiconductor wafers; and a wafer fusion step of fusing said two semiconductor wafers after completion of the fine alignment while letting said lattice layers facing each other be stacked over each other, wherein said light beam is non-coherent infrared light.

2. The method for manufacturing a semiconductor device as recited in claim 1,, characterized in that at said wafer fabrication step, said lattice layer is formed while setting said adjustment lattice period to range from 2 $\mu$m to 5 $\mu$m.

3. The method for manufacturing a semiconductor device as recited in claim 1, characterized in that at said wafer fabrication step, said lattice layer is formed while setting said adjustment lattice period at an odd multiple of said crystal lattice period.

4. The method for manufacturing a semiconductor device as recited in claim 1, characterized in that at said wafer fusion step, hydrophilic processing is applied before fusion to said one surface of each said semiconductor wafer with said lattice layer formed thereon.

* * * * *